United States Patent
Huynh et al.

(10) Patent No.: US 7,558,539 B2
(45) Date of Patent: Jul. 7, 2009

(54) POWER CONTROL FEEDBACK LOOP FOR ADJUSTING A MAGNITUDE OF AN OUTPUT SIGNAL

(75) Inventors: Phuong T. Huynh, Annandale, VA (US); Nitin Sharma, Centreville, VA (US)

(73) Assignee: Freescale Semiconductor, Inc., Austin, TX (US)

( * ) Notice: Subject to any disclaimer, the term of this patent is extended or adjusted under 35 U.S.C. 154(b) by 509 days.

(21) Appl. No.: 11/238,986

(22) Filed: Sep. 30, 2005

(65) Prior Publication Data

US 2007/0206523 A1    Sep. 6, 2007

(51) Int. Cl.
H04B 1/04    (2006.01)
(52) U.S. Cl. ............... 455/126; 455/114.3; 455/127.1; 455/115.1; 455/127.2
(58) Field of Classification Search ............. 455/126, 455/114.3, 127.1, 115, 127
See application file for complete search history.

(56) References Cited

U.S. PATENT DOCUMENTS

| | | | |
|---|---|---|---|
| 5,293,407 A | 3/1994 | Shibata | |
| 5,448,770 A | 9/1995 | Hietala et al. | |
| 6,370,364 B1 * | 4/2002 | Liimatainen | 455/126 |
| 6,880,114 B2 * | 4/2005 | Harres | 714/709 |
| 7,116,951 B2 * | 10/2006 | Nagode et al. | 455/126 |
| 7,190,931 B2 * | 3/2007 | Casper et al. | 455/69 |
| 2001/0006888 A1 | 7/2001 | Posti et al. | |

* cited by examiner

Primary Examiner—Sanh D Phu

(57) ABSTRACT

A circuit for adjusting a magnitude of a transmit signal includes a transmitter (105), providing a transmit signal (107). It also includes a transmitter amplifier (109), receiving the transmit signal (107) and a power control adjustment signal (121), and responsive thereto, providing an amplified transmit signal (111). The circuit also includes a detector (123), for detecting an amplitude of the amplified transmit signal (111). Also included is an error component (137) for determining the difference between the amplitude and a reference level (129). Further provided is a digital signal generator (155), receiving the difference (145), and responsive thereto, generating (157) a reference signal (125) and the power control adjustment signal (117, 121), where the reference level (129) is responsive to the reference signal (125).

17 Claims, 6 Drawing Sheets

(1) Vcm+Vp-VBE
(2) Vcm-iDAC*R-VBE (1) PkDtct_Rst

POWER CONTROL FEEDBACK LOOP FOR ADJUSTING A MAGNITUDE OF AN OUTPUT SIGNAL

FIELD OF THE INVENTION

The present invention relates in general to wireless communication units and wireless networks, and more specifically to controlling the magnitude of an output signal.

BACKGROUND OF THE INVENTION

One of the requirements for an ultra wide band (UWB) device is compliance with the spectrum mask mandated by spectrum regulators. In the United States, the spectrum mask is prescribed by the Federal Communication Commission (FCC). Other countries have similar regulators and may have their own requirements for spectrum masks.

Although the amplitude of signals which are transmitted should not exceed the spectrum masks, it is desirable for a transmit signal to efficiently use the permissible spectrum without violating the spectrum mask. Therefore, the spectrum of a signal that is being transmitted can be shaped, to more efficiently fill out the spectrum mask. There may be other reasons to utilize a particular amplitude for a signal, for example a particular type of device.

One way to shape the spectrum of a transmitted signal is to control the power of the transmitter in a transmission system utilizing an analog feedback loop. However, adjustments to the power provided to the transmission system cannot be effectively used to provide prompt control of the spectrum of a signal that is in the process of being transmitted, because of the closed loop feedback that is conventionally used in a transmission system.

In a transmission system having an analog feedback loop, power changes typically are detected and responded to gradually. The feedback loop is provided to compensate for changes in amplitude of the transmission signal, which are perceived as errors. The feedback loop tends to dampen changes in amplitude to the power.

BRIEF DESCRIPTION OF THE DRAWINGS

The accompanying figures where like reference numerals refer to identical or functionally similar elements and which together with the detailed description below are incorporated in and form part of the specification, serve to further illustrate an exemplary embodiment and to explain various principles and advantages in accordance with the present invention.

DETAILED DESCRIPTION

Figure 1:
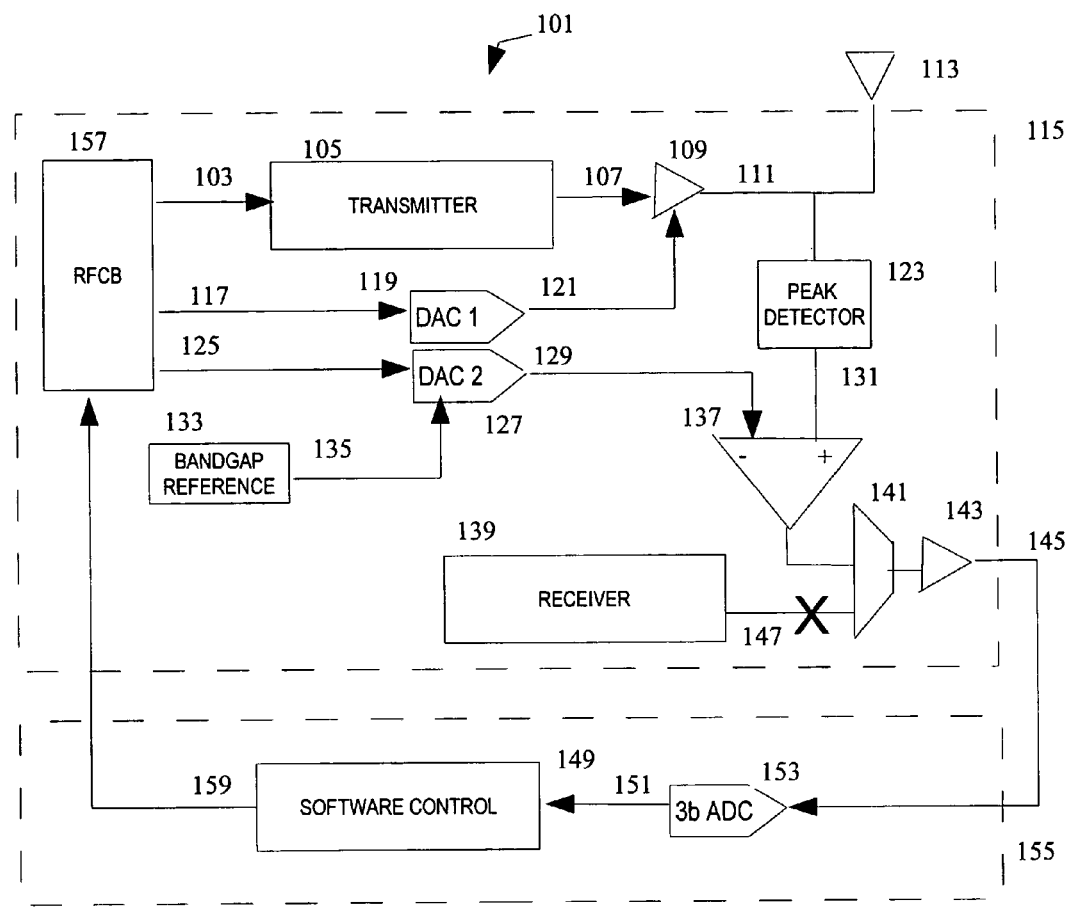
FIG. 1 is a block diagram illustrating an exemplary circuit for adjusting a magnitude of a transmit signal in accordance with various exemplary embodiments.

In overview, the present disclosure concerns wireless communications devices or units, often referred to as communication units, such as cellular phone or two-way radios and the like having transmission operating capability, such as can be associated with a communication system such as an Enterprise Network, a cellular Radio Access Network, or the like. Such communication systems may further provide services such as voice, multimedia and data communications services. More particularly, various inventive concepts and principles are embodied in systems, circuits, communication units, and methods therein for adjusting power control which can be associated with a transmission from a communication unit. One or more embodiments may include a digital feedback loop in a power control adjustment system, circuit, communication unit, and method therefore.

The instant disclosure is provided to further explain in an enabling fashion the best modes of performing one or more embodiments of the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; that is, processes or steps that are not so limited may be performed in any order.

Much of the inventive functionality and many of the inventive principles when implemented, are best supported with or in software and/or integrated circuits (ICs), such as a digital signal processor and software therefore and/or application specific ICs. It is expected that one of ordinary skill, notwithstanding possibly significant effort and many design choices motivated by, for example, available time, current technology, and economic considerations, when guided by the concepts and principles disclosed herein will be readily capable of generating such software instructions and/or ICs with minimal experimentation. Therefore, in the interest of brevity and minimization of any risk of obscuring the principles and concepts according to the present invention, further discussion of such software and ICs, if any, will be limited to the essentials with respect to the principles and concepts used by the exemplary embodiments.

As further discussed herein below, various inventive principles and combinations thereof are advantageously employed to provide a transmit power control that can change promptly. For example, it can be desirable to control the magnitude of a 100 mV peak to peak signal to change to 1V. The control can occur to match the change of modes, such as when a communication unit changes between different operational modes. In addition, transmit power in a particular communication unit can fluctuate, for example, as a circuit heats up, which tends to cause the gain to a transmitter antenna to change, further causing the transmit power to change. Also, transmit power can differ between various units due for example to production variances, further causing disparities in transmit power from a desired transmit power. Differences in power can be periodically sampled, and various adjustments to the power level can be made with reference to a signal that is independent of process, temperature, or production variances.

Further in accordance with exemplary embodiments, there is provided a transmit feedback control loop that can respond to changes in power control without dampening the changes. By providing a digital control in conjunction with the feedback loop, the power can be controlled accurately and promptly.

Referring now to FIG. 1, a block diagram illustrating an exemplary circuit for adjusting a magnitude of a transmit signal in accordance with various exemplary embodiments will be discussed and described. A circuit 101 for adjusting a magnitude of a transmit signal can include an analog portion 115 and a digital signal generator 155. In overview, the analog portion 115 can include a control bus such as the illustrated RF control bus (RFCB) 157, a transmitter 105, digital to analog converters DAC1 and DAC2 119, 127, transmitter amplifier 109, peak detector 123, and error detecting component 137. One or more embodiments optionally provide that the analog portion 115 can include a receiver 139, multiplexer 141, and amplifier 143. The digital signal generator 155 can include an analog to digital converter (ADC) 153 and a software control 149.

The error detecting component 137 can be used to determine a difference between an amplitude of the transmit signal and a reference level 129, and can output a difference signal 145 representative of the difference. The difference signal 145 can be received by the digital signal generator 155. The digital signal generator 155 can provide a digital signal 159 containing data which can be utilized to generate a power control adjustment signal 117 and a reference signal 125. The reference signal 125 produced by the digital signal generator 155 and indicated in the digital signal 159 can be converted from digital to analog to provide the reference level 129 utilized by the error detecting component 137. Also, the power control adjustment signal 117 can be utilized by DAC2 127 to adjust the gain of the transmitter amplifier 109.

The connections between various ones of these elements are described in more detail below.

In the illustrated embodiment, a control bus, here represented by the RFCB 157, receives digital signals, including signals generated by the digital signal generator 155. The signals that are provided over the control bus can include information representative of a reference and/or a power control adjustment. Also, the control bus 157 can receive a digital representation of a signal for transmission (not illustrated) over the antenna 113.

The control bus 157 can receive the digital representation of the signal to be transmitted and can provide a transmission signal 103 to the transmitter 105. Components in the transmitter 105 are well understood and are not discussed further herein. The transmitter 105 can provide a transmit signal 107 to the transmit amplifier 109. The transmit amplifier 109 amplifies the signal, and provides an amplified transmit signal 111 to an antenna 113. The antenna 113 transmits the signal in accordance with known conventions.

The amplified transmit signal 111 is also provided to the peak detector 123 which detects the amplitude of the amplified transmit signal 111. The peak detector 123 provides an indication of transmit power output. The transmit power output can vary based on power, temperature, and other conditions. More particularly, the peak detector 123 can detect the peaks in the amplified transmit signal 111. The peak detector 123 provides an amplitude signal 131 representing the detected amplitude, which can be used for example by the error component 137, described below in more detail.

The control bus 157 can provide the power control adjustment signal 117 in digital form to the digital-to-analog converter DAC1 119. The control bus 157 can receive the digital signal 159 including an indication of the power control adjustment from the software control 149, and can provide the digital power control adjustment signal 117 to the DAC1 119. The DAC1 119 can convert the digital power control adjustment signal 117 to an analog power control adjustment signal 121. The analog power control adjustment signal 121 can be provided to the transmitter amplifier 109. Moreover specifically, the analog power control adjustment signal 121 can adjust the gain of the transmit amplifier 109. Therefore, the digital signal generator 155 can control an adjustment of the gain of the transmitter amplifier 109, via DAC1 121.

The control bus 157 can provide the reference signal 125 in digital form to the digital-to-analog converter DAC2 127. The DAC2 127 also can receive a bandgap reference signal 135 from a bandgap reference component 133. The bandgap reference component 133 can generate a voltage as the bandgap reference signal 135 in accordance with conventional techniques. The reference signal 125 can be utilized by the DAC2 127 to indicate which subsets of the voltage are to be derived, e.g., 50% of the bandgap reference signal 135, in order to produce the reference level 129. The reference level 129 can be provided to the error component 137.

The error component 137 can receive the detected amplitude 131 and the reference level 129 and can provide a signal indicative of the difference 145. The difference between the reference level 129 and the detected amplitude 131 can be utilized, for example by the digital signal generator 155, in controlling an adjustment to the gain of the transmitter amplifier 109.

One or more embodiments optionally can provide the receiver 139, the multiplexer 141, and/or the amplifier 143, which can be omitted in other embodiments. In the illustrated embodiment, the receiver 139 is conventionally provided with the communication unit, and can produce a receive signal 147 in accordance with known techniques. The receive signal 147 can be provided to the digital signal generator 155, through the multiplexer 141. The optional multiplexer 141 can multiplex between the difference signal and the receive signal 147. The optional amplifier 143 can amplify the output of the multiplexer 141. The difference signal 145 can be supplied from the amplifier 143 to the digital signal generator 155. Accordingly, one or more alternative embodiments provide that the difference is a signal provided by the error component; and the circuit includes a multiplexer, multiplexing between a receive signal from a receiver corresponding to the transmitter, and the difference, to provide the difference and the receive signal to the digital signal generator. Further, one or more embodiments can provide that the multiplexer selects between the receive signal and the difference responsive to the digital signal generator.

The digital signal generator 155 can receive the difference signal 145 from the analog portion 115, and can generate the digital signal 159 containing information representative of the reference signal and/or the power adjustment signal. One or more embodiments provide that the digital signal generator 155 is a digital baseband chip. Accordingly, one or more embodiments provides a digital signal generator that includes an analog to digital circuit receiving the difference and generating a digital difference signal representative of the difference; and a processor configured to facilitate receiving the digital difference signal, processing the difference, and adjusting the reference signal and the power control signal responsive to the difference.

The difference signal 145 can be provided in analog form when received by the digital signal generator 155. The ADC 153 can receive the difference signal 153 and convert the difference signal from analog to provide a digital difference signal 151 having bit values. In the illustrated embodiment, the ADC 153 is a 3 bit ADC and converts the analog difference signal to a 3 bit signal. However, the ADC could be any number of bits, for example, an eight bit ADC. Therefore, one or more embodiments provide that the analog to digital circuit is an n-bit analog to digital circuit, where n is two or more. The ADC can be shared with other components (not illustrated) in the digital signal generator 155 if convenient.

The software control 149 can receive the digital difference signal 151. The software control 149 can process the bit values in the digital difference signal 151 and can determine whether and/or how the transmit power control should be adjusted. Also, the software control 149 can determine whether and/or how the reference level should be adjusted. The software control 149 can provide a digital control signal 159, for example to the control bus 157, effecting the adjustment to the reference level and/or the transmit power control.

More particularly, the software control 149 can periodically sample the digital difference signal 151. The software can effect the adjustment to the reference level and/or the transmit power control, for example if the digital difference signal is in a target range or has exceeded a threshold level. Moreover, the software control 149 can control the reference level and/or the transmit power control in response to one or more modes that can be utilized in connection with the transmitter, such as transmit mode, acquisition mode, and the like. For example, a mode can be associated with different power levels used during transmission in a UWB network. In one or more embodiments, the different transmit power levels and reference levels corresponding to the modes can be pre-stored, for example in one or more registers (not illustrated) in the control block 157. The software control 149 can select a reference level corresponding to the particular mode, such as by providing a value to the control block 157. The particular mode can be indicated to the software control 149 by an appropriate signal, such as may be defined in a protocol standard. One or more embodiments provide for modes which can further be selected responsive to another indicator, such as transmitter type, transmission radius, or the like.

Accordingly, one or more embodiments provides a circuit for adjusting a magnitude of a transmit signal. The circuit includes a transmitter, providing a transmit signal. Also included is an amplifier, receiving the transmit signal and a power control adjustment signal, and responsive thereto, providing an amplified transmit signal. Further provided is a detector, for detecting an amplitude of the amplified transmit signal. Also provided is an error component for determining the difference between the amplitude and a reference level; and a digital signal generator, receiving the difference, and responsive thereto, generating a reference signal and the power control adjustment signal. Moreover, the reference level can be responsive to the reference signal.

Optionally, one or more embodiments accommodate pre-calibrating the control block 157. The data for the power levels and/or reference levels can be initially stored in an appropriate location of the control block 157 (such as pre-defined registers), so that the control block 157 can later use the data in adjusting the power level and/or reference level. The data can be determined based on, for example, the type of transmitter, communication unit, communication protocol, spectrum regime, and/or transmission range. The control block 157 can therefore be pre-calibrated. Alternative embodiments, for example as described in connection with FIG. 2, can omit the control block.

Accordingly, one or more alternative embodiments provide that the circuit includes a first digital to analog converter, for converting the reference signal from digital to analog; a second digital to analog converter, for converting the power control adjustment signal from digital to analog; and a radio frequency control block, receiving the reference signal and the power control adjustment signal, and translating the reference signal and the power control adjustment signal to values for the first digital to analog converter and the second digital to analog converter.

Figure 2:
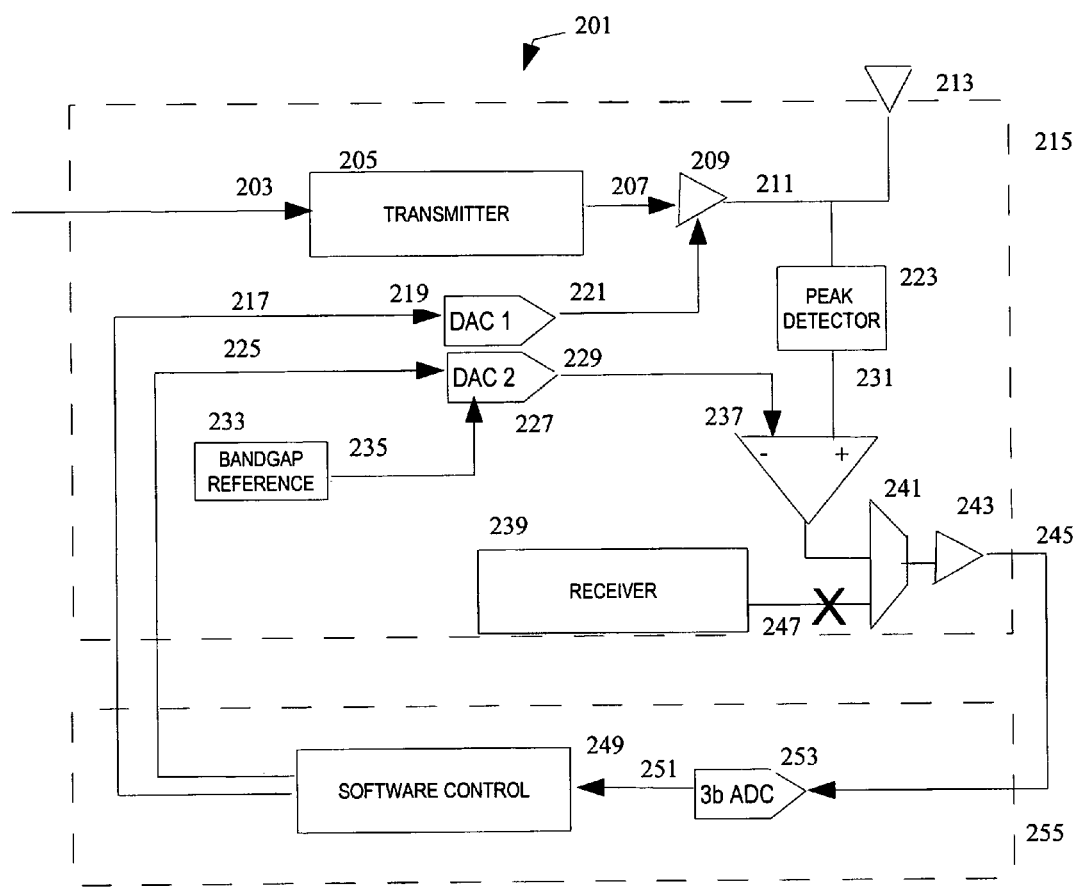
FIG. 2 is a block diagram illustrating another exemplary circuit for adjusting a magnitude of a transmit signal in accordance with various alternative embodiments.

Referring now to FIG. 2, a block diagram illustrating another exemplary circuit for adjusting a magnitude of a transmit signal in accordance with various alternative embodiments will be discussed and described. FIG. 2 utilizes reference numbers similar to FIG. 1 for like components.

A circuit 201 for adjusting a magnitude of a transmit signal can include an analog portion 215 and a digital signal generator 255. The analog portion 215 can include a transmitter 205, digital to analog converters DAC1 and DAC2 219, 227, a transmitter amplifier 209, a peak detector 223, an error component 237, an optional receiver 239, an optional multiplexer 241, and an amplifier 243. The digital signal generator 255 can include an analog to digital converter (ADC) 253 and a software control 249.

The error component 237 can determine the difference between the amplitude and a reference level 229 as previously explained, and can output a difference signal 245 representative of the difference. The difference signal 245 can be fed to the digital signal generator 255, which can provide a power control adjustment signal 217 and a reference signal 225.

The reference signal 225 produced by the digital signal generator 255 can be in a digital format and having a value appropriate for indicating a desired setting for a reference level 229 to the DAC2 227. The power control adjustment signal 217 can be in a format and having a value appropriate for adjusting the gain of the transmitter amplifier 209 after being converted from digital to analog via the DAC1 219. In comparison with the exemplary embodiment illustrated in FIG. 1, no control bus is provided in FIG. 2. More particularly, in the example of FIG. 2, the DACs 219, 227 can directly receive the digital signals generated by the digital signal generator 255.

A transmission signal 203 can be provided to the transmitter 205 in accordance with known techniques, and the transmitter 205 can provide a transmit signal 207 to the transmit amplifier 209. The transmitter 205 can include conventional components. The transmit amplifier 209 can amplify the signal, and can provide an amplified transmit signal 211 to an antenna 213. The antenna 213 can transmit the signal in accordance with known techniques.

The amplified transmit signal 211 also can be provided to a peak detector 223 which can detect the amplitude of the amplified transmit signal 111, as previously described. The peak detector 223 can provide an amplitude signal 231 representing the detected amplitude, which can be used by the error component 237.

The digital signal generator 255 can provide the power control adjustment signal 217 to the analog converter DAC1 219. The DAC1 219 can convert the power control adjustment signal 217 from digital to analog to provide an analog power control adjustment signal 221. The analog power control adjustment signal 221 can adjust the power to the transmitter amplifier 209, for example by controlling the gain.

The digital signal generator 255 can provide the reference signal 225 to the analog converter DAC 2 227. The DAC 2 can also receive a bandgap reference signal 235 from a bandgap reference component 233. The reference signal 225 can be used to derive the reference level signal 229 from the bandgap reference signal 235. The reference level signal 229 can then be provided to the error component 237. The error component 237 can receive the detected amplitude 231 and the reference level 237 and can provide a signal indicative of an error in the detected amplitude 231, such as the difference between the detected amplitude 231 and the reference level 237.

In the illustrated embodiment, a conventional receiver 239 is included in the analog portion 215 of the circuit, and can produce a receive signal 247 which optionally can be provided to the digital signal generator 255, through the optional multiplexer 241 which can multiplex between the difference signal and the receive signal 247. The amplifier 243 can amplify the output of the multiplexer 241, and can provide the difference signal 245 to the digital signal generator 255.

The digital signal generator 255 can receive the difference signal 245 from the analog portion 215, and can generate digital signals 217, 225. The difference signal 245 can be converted from analog to a digital difference signal 251 by the ADC 253. The ADC 253 can be shared with other conventional components (not illustrated), if desired.

The software control 249 can receive the digital difference signal 251, can process the difference and can determine whether/how the reference level should be adjusted and/or whether/how the transmit power control should be adjusted, as previously described. The software control 249 can provide the power control adjustment signal 217 and/or the reference signal 225 to the analog portion 215.

The transmit signal 207 and/or the amplified transmit signal 211 can be single-ended or differential. In accordance with one or more embodiments, the transmit signal is single-ended. One or more alternative embodiments provide that the transmit signal is differential.

Figure 3:
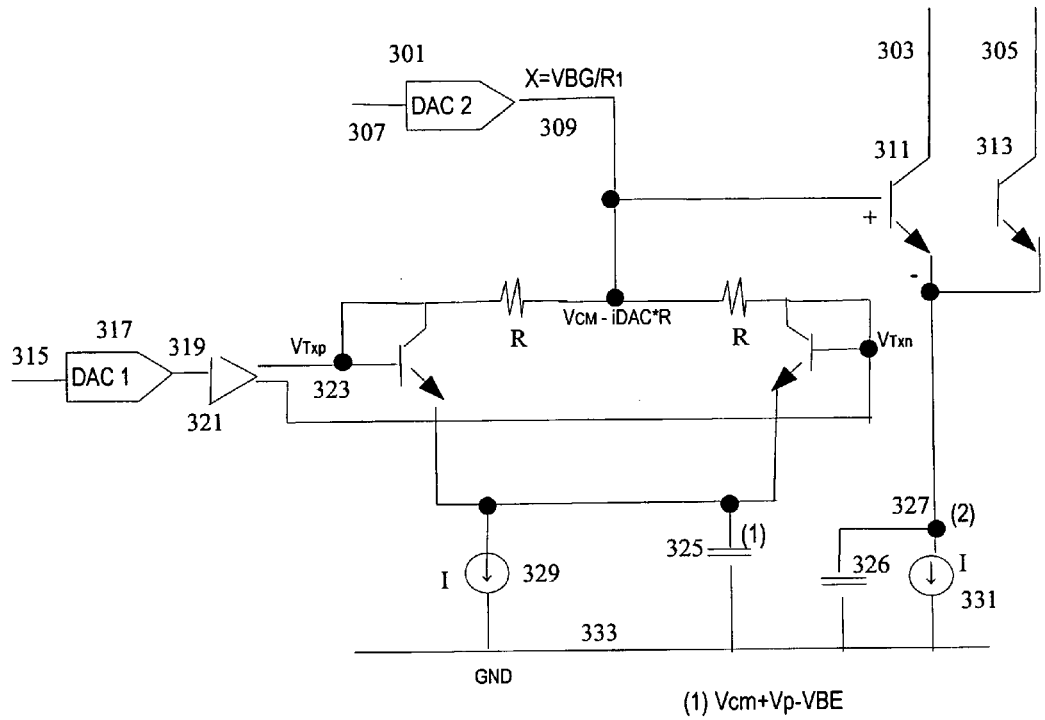
FIG. 3 is a schematic diagram illustrating an exemplary circuit for detecting peaks in a signal, in accordance with one or more embodiments.

Referring now to FIG. 3, a schematic diagram illustrating an exemplary circuit for detecting peaks in a signal, in accordance with one or more embodiments will be discussed and described. One of the issues that can be faced in a feedback control is zeroing out an error voltage. As a circuit heats up, the gain to the transmitter begins to reduce, leading to a drop in power. One or more embodiments can provide a peak detect circuit which can track out temperature, process, and/or common mode variations that can cause fluctuations in the error voltage. FIG. 3 illustrates an exemplary circuit in combination with various portions of the power control feedback.

A reference signal 307 can be received at a DAC2 301, together with a bandgap reference (not illustrated) as previously discussed. The DAC2 301 can be programmed to derive a voltage off of the bandgap reference, so that the bandgap reference is multiplied or divided by the reference signal 307. The magnitude of a constant current such as a reference level 309, provided by the bandgap reference can be controlled through the DAC2 301. The DAC2 301 can allow the reference level 309 to be set, for example to a pre-determined value selected by a user.

The DAC2 301 can provide the reference level 309 of $X=VBG/R_1$, where X is the reference level, VBG is the bandgap voltage, and $R_1$ is the resistance used to generate the bandgap reference current. Resistors R are linked to the reference level signal 309 to provide Vcm−iDAC*R, where iDAC is the reference level X and Vcm=common mode voltage. Power supply lines, including lines 303, 305 each can be provided. Bias signals I 329, 331 can be provided, for example with reference to a ground signal 333.

A power control adjustment signal 315 is received at DAC1 317, where it is converted from digital to analog to provide analog power control adjustment signal 319 which is amplified 321. Differential transmit voltage $V_{Txp}$ and $V_{Txn}$ can be provided to symmetric bipolar junction transistors 323.

Peak voltage can detected as the difference:

$$Vcm+Vp-VBE \quad (1)$$

where Vcm=common mode voltage
Vp=peak voltage,
VBE=base emitter voltage, also illustrated as a peak detect voltage as equation (1) in FIG. 3. The peak detect voltage can be stored at a first capacitor 325.

The reference level X 309 can be provided from DAC 2 301, dropped across the resistors R, and then VBE of transistors 311, 313, to provide $$Vcm-iDAC*R-VBE \quad (2)$$

at a node 327, also illustrated as equation (2) in FIG. 3.

Considering equation (1) over equation (2), $$Vcm+Vp-VBE-Vcm-iDAC*R-VBE \quad (3)$$

Vcm and VBE cancel out, yielding:

$$Vp=iDAC*R \quad (4)$$

Or, by solving the equation, $$Vp-iDAC*R=0 \quad (5)$$

Accordingly, peak detect voltage can be detected when $$iDAC*R=Vp \quad (6)$$

The peak detect voltage can be provided at the first capacitor 325 and the error voltage can be provided at a second capacitor 326. In the case where the DAC adjusting the power control, that is DAC1 317, provides a gain that is too high or too low, the error voltage 326 can be monitored and the gain can be adjusted to be brought to zero, since an error voltage of 0V indicates that the peak voltage Vp and reference voltage iDAC*R are equal.

Accordingly, one or more embodiments can include a peak detector, where the detector is configured to track out variations in at least one of a temperature, a process corner and a common-mode voltage.

Figure 4:
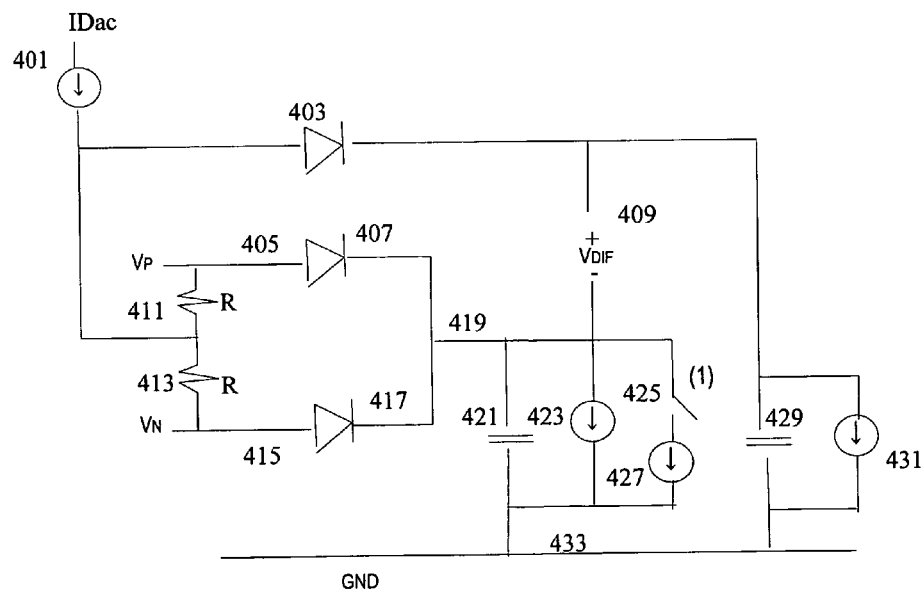
FIG. 4 is a top level schematic diagram illustrating an exemplary peak detect circuit in accordance with one or more embodiments.

Referring now to FIG. 4, a top level schematic diagram illustrating an exemplary peak detect circuit in accordance with one or more embodiments will be discussed and described. FIG. 3 generally illustrates a lower level schematic than is illustrated in FIG. 4.

A reference level iDAC 401 can be derived via a band-gap voltage reference. An output of the voltage reference can be used to derive a current which is independent of temperature and voltage.

The reference level 401 can be provided to first and second transistors 407, 417 across first and second resistors R 411, 413 together with a differential voltage Vp 405 and Vn 415. A difference between the peak voltage 405 or the bottom voltage 415 and the common mode voltage can provide the amplitude 419.

The reference level 401 also can be provided to a third transistor 403. A difference 409 between the amplitude 419 and the reference level 401 can provide a peak detect value.

A first capacitor 421 can be provided, to hold the peak detect value, for example as the peak detect voltage as determined in equation (1). A peak detect reset PkDtct_Rst switch 425 can be provided. The peak detect reset switch 425 can enable a discharge of the first capacitor 421. The first capacitor 421 can hold the peak detect value, as described in connection with FIG. 3.

A second capacitor 429 can hold the error value, such as the error voltage discussed in connection with equation (2). A first, second, and third bias 423, 427, 431 can provide bias to the circuit. Bias can be provided, for example with reference to a ground signal 433.

Figure 5:
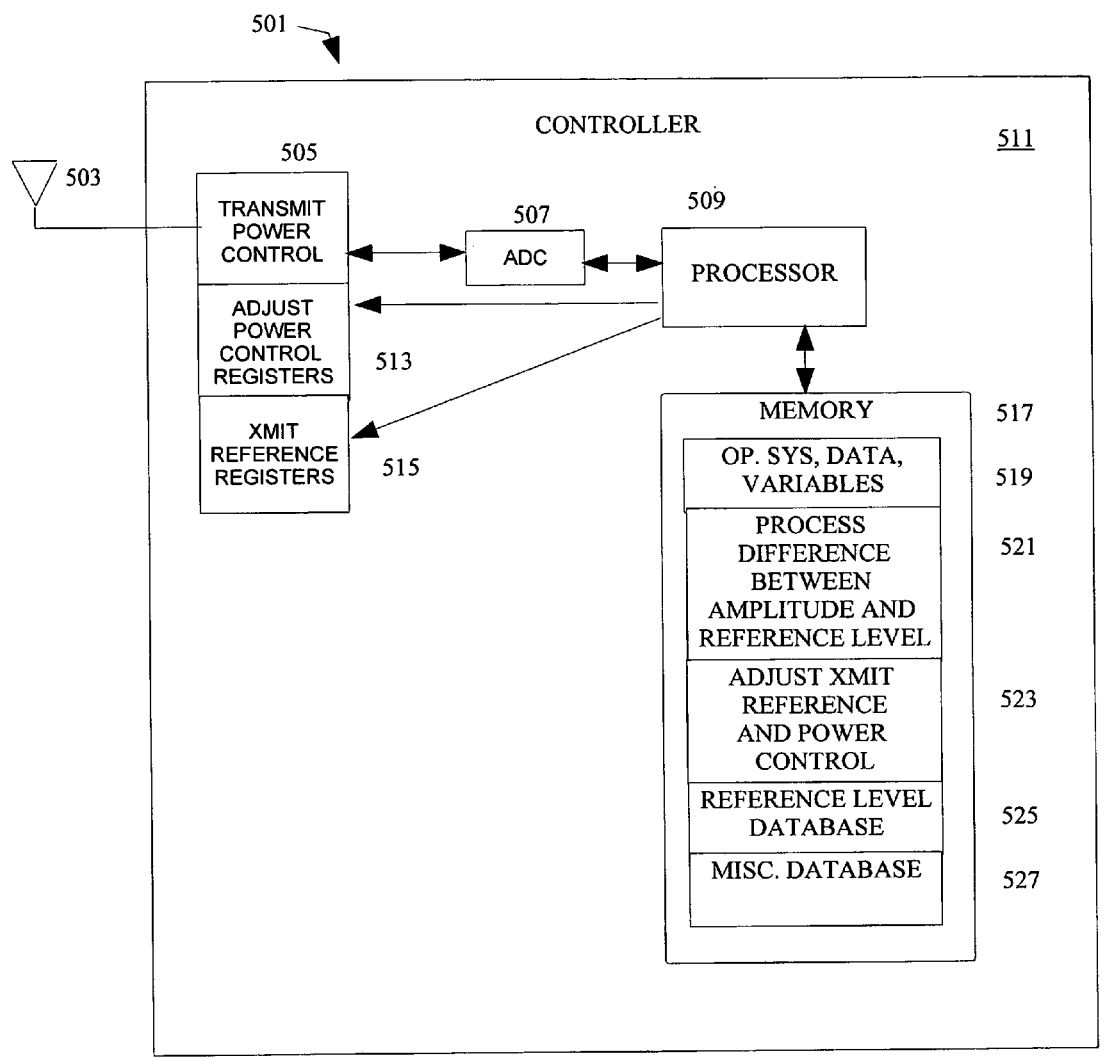
FIG. 5 is a block diagram illustrating portions of an exemplary communication unit with transmit power control in accordance with various exemplary embodiments.

Referring now to FIG. 5, a block diagram illustrating portions of an exemplary communication unit with transmit power control in accordance with various exemplary embodiments will be discussed and described.

The communication unit 501 may include a transmitter antenna 503 (or transceiver), and a controller 511. The controller may include a processor 509, a memory 517, and optionally other peripherals such as a display (not illustrated), microphone (not illustrated), speaker (not illustrated), and/or a user input device such as a keypad (not illustrated).

The processor 509 may comprise one or more microprocessors and/or one or more digital signal processors. The memory 517 may be coupled to the processor 509 and may comprise a read-only memory (ROM), a random-access memory (RAM), a programmable ROM (PROM), and/or an electrically erasable read-only memory (EEPROM).

The memory 517 may include multiple memory locations for storing, among other things, an operating system, data and variables 519 for programs executed by the processor 509; computer programs for causing the processor to operate in connection with various functions such as processing the difference between the amplitude and a reference level 521, adjusting the transmit reference level and/or power control 523, and/or other processing; a database 525 of various reference levels; and a database 527 for other information used by the processor 509. The computer programs may be stored, for example, in ROM or PROM and may direct the processor 509 in controlling the operation of the communication unit 501. The computer programs may be loaded into the memory 517, for example from a computer readable medium comprising instructions for execution by a computer.

The transmitter antenna 503 can communicate with the processor 509 via transmit components that are well understood in the art, and accordingly are omitted for clarity in this discussion. Also illustrated is a transmit power control 505 that can be configured for operation in connection with the transmitter antenna 503 and the transmit components.

The transmit power control 505 can accommodate various methods for adjusting the power control and/or the reference level. In the illustrated embodiment, the transmit power control 505 can utilize registers for the adjusting, specifically, one or more adjust power control registers 513 and one or more transmit reference registers 515. In the illustrated embodiment, the adjust power control registers 513 and the transmit reference registers 515 can be set by the processor 509.

The processor 509 can receive a signal from the transmit power control 505. The signal can be converted from analog to digital by an ADC 507. The digital signal provided by the ADC can be, for example, a difference between the amplitude and the reference level, detected by the transmit power control 505.

The processor 509 may be programmed for processing the difference between the amplitude and a reference level 521. If the amplitude is not the same as the reference level, for example, if the difference is plus or minus, then the processor 509 can indicate an amount of gain for adjusting the power control.

The processor 509 may be programmed for adjusting the transmit reference level and/or the power control 523. The power control can be adjusted, for example, if the processor 509 indicates an amount of gain for adjusting the power control. The power control can be adjusted by indicating the gain to the transmit components, for example, by storing an appropriate value in the adjust power control registers 513. One convenient method for storing the appropriate values is in conjunction with gain levels stored in a table in the reference level database 525.

The transmit reference level can be adjusted in conjunction with the power control and/or independently of the power control. For example, the reference level can be adjusted to suit determinants such as a particular spectrum mask, and/or a transmission mode, and/or a type of the communication unit 501, and/or other situations such as low transmit radius. The reference level appropriate for the determinants can be pre-determined in accordance with known techniques, and stored for later use, e.g., in the reference level database 525. The reference levels can be stored in the reference level database 525, for example, in conjunction with the determinants of the reference level. The reference level can be adjusted, for example, by storing an appropriate value in the transmit reference registers 515. Accordingly, one or more embodiments provide for a plurality of the reference levels including the specific reference level, the reference levels being pre-determined.

Figure 6:
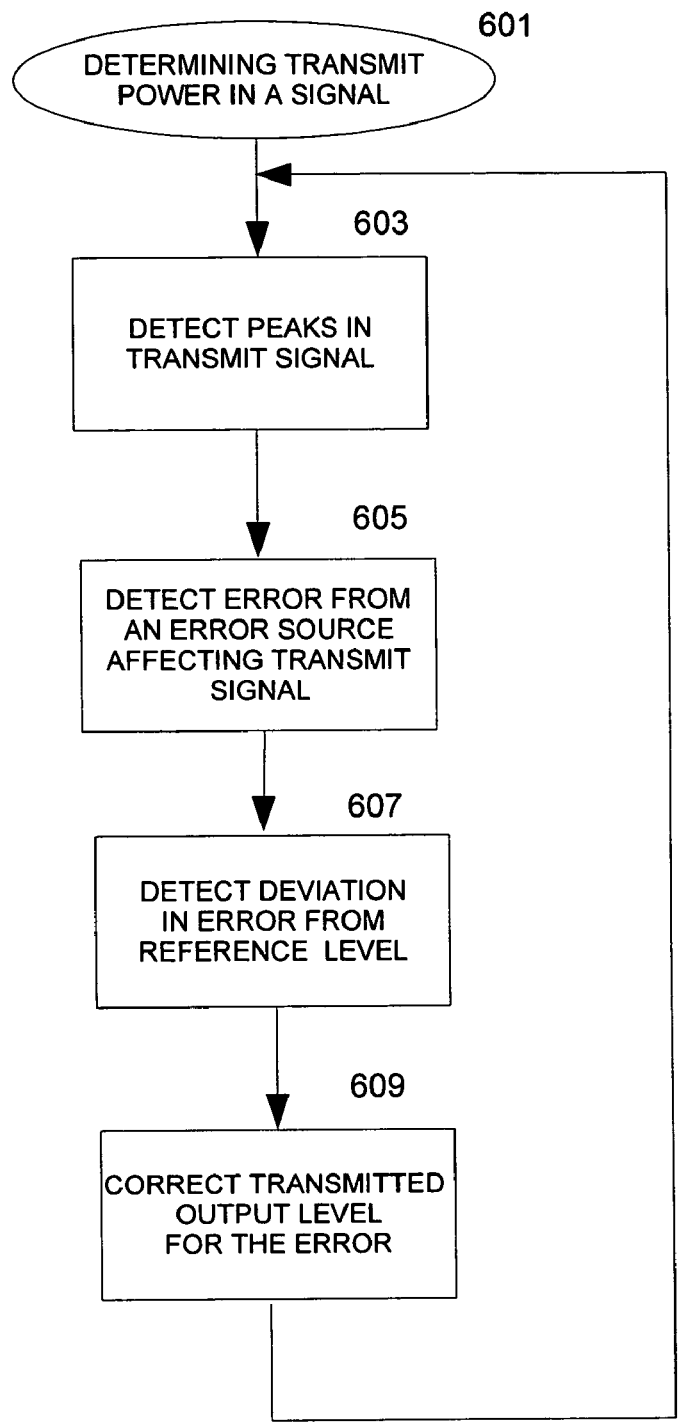
FIG. 6 is a flow chart illustrating an exemplary procedure for determining transmit power in a signal, in accordance with various exemplary and alternative exemplary embodiments.

Referring now to FIG. 6, a flow chart illustrating an exemplary procedure for determining transmit power in a signal, in accordance with various exemplary and alternative exemplary embodiments will be discussed and described. This can advantageously be implemented in, for example, a circuit such as described in connection with FIG. 3 or FIG. 4, or other apparatus appropriate arranged.

In overview, determining the transmit power in a signal 601 can include detecting 603 peaks in the transmit signal, detecting 605 an error from an error source affecting the transmit signal, detecting 607 a deviation in error from a reference level, and correcting 609 a transmitted output level for the error. Each of these will be discussed in more detail below, although some details which have been previously described may be omitted to avoid obscuring the discussion.

The process for determining transmit power in a signal 601 can include detecting 603 peaks in the transmit signal. The peaks can be determined, for example by comparing to a threshold value, or detecting where the amplitude changes from increasing to decreasing.

The process can include detecting 605 an error from an error source affecting the transmit signal. Error sources that can affect the transmit signal include, for example, changes in temperature including any other environment changes, process corner variations such as those introduced by production processing, and/or changes in common-mode voltage.

Accordingly, one or more embodiments provide that at least one error source is at least one of temperature variation and process corner variation. One or more embodiments provide that the error source is common mode voltage, wherein the detecting further comprises obtaining a difference between the actual peak voltage and the common mode voltage. Also, one or more alternative embodiments can provide that the error source is a resistor, wherein a DAC current is proportional to the tolerance of the resistor.

The process also can provide for detecting 607 an error which causes a deviation from a reference level. The error can be detected, for example by determining the amplitude of the transmit signal and determining whether there is a deviation in the amplitude from the reference level. Where the error causes a deviation from the reference level, the deviation can be detected and corrected.

Also, the process can provide for correcting 609 a transmitted output level for the error. The transmitted output level should be corrected to compensate for the error. A correction of the transmitted output level can be effected by controlling, for example, a transmitter or other device which controls the transmitted power level. The transmitted power level can thereby be compensated for errors in process, common mode, and/or temperature causing changes in amplitude compared to a reference level.

Accordingly, one or more embodiments can provide a method for determining transmit power in a signal. The method can include detecting peaks in a transmit signal; detecting an error from at least one error source affecting the transmit signal, relative to a reference level; detecting a deviation in the error from an error level; and correcting a transmitted output level for the error.

Figure 7:
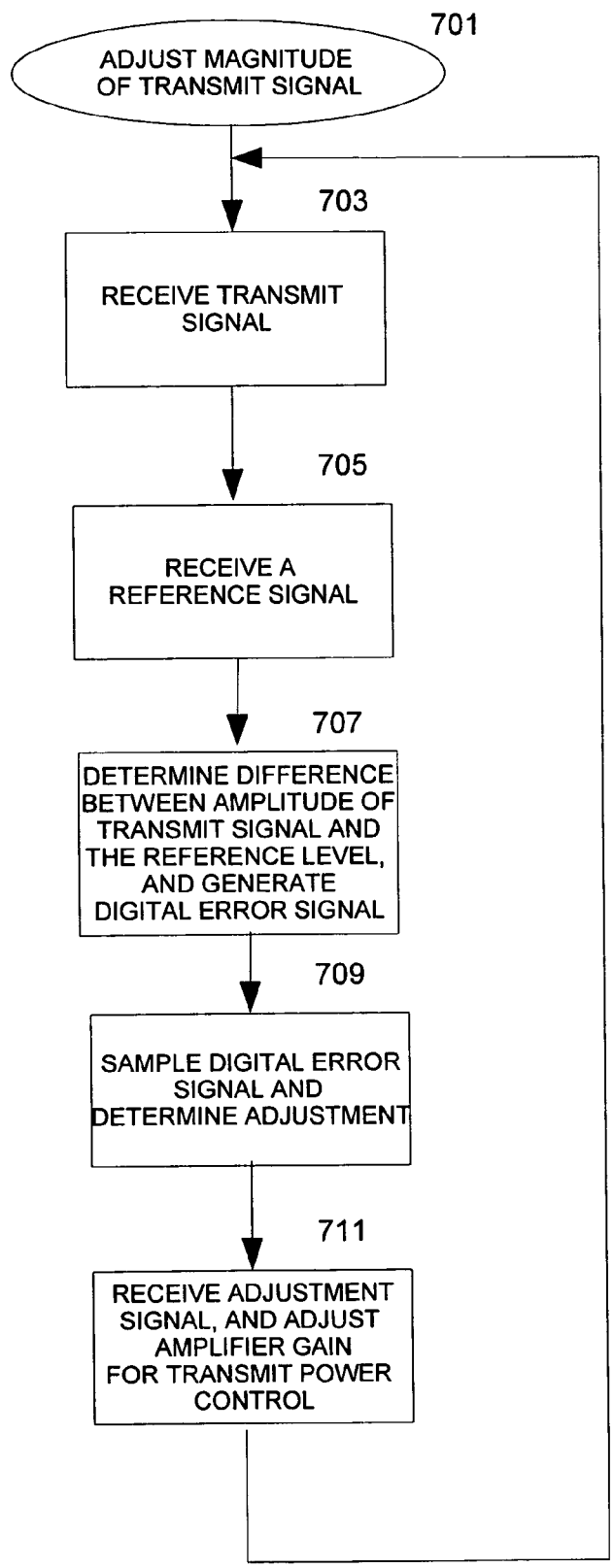
FIG. 7 is a flow chart illustrating an exemplary procedure for adjusting the magnitude of a transmit signal, in accordance with various exemplary embodiments.

Referring now to FIG. 7, a flow chart illustrating an exemplary procedure for adjusting the magnitude of a transmit signal, in accordance with various exemplary embodiments will be discussed and described. The procedure can advantageously be implemented in connection with, for example, a processor of a controller, described in connection with FIG. 5 and/or other apparatus appropriately arranged.

In overview, the procedure for adjusting the magnitude of a transmit signal 701 can include receiving 703 the transmit signal, receiving 705 a reference signal, determining 707 a difference between the amplitude of the transmit signal and the reference level, and generating a digital error signal, sampling 709 the digital error signal and determining an adjustment, and receiving 711 an adjustment signal and adjusting the amplifier gain for the transmit power control. Each of these will be discussed below, although various details which have been previously described may be omitted for clarity.

The procedure 701 can provide for receiving 703 the transmit signal, where the transmit signal has an amplitude. The amplitude can be determined, for example from the peak and bottom of the transmit signal. Optionally, the amplitude can be adjusted to compensate for errors as discussed for example in connection with FIG. 3 or FIG. 4.

Also, the procedure 701 can provide for receiving 705 a reference signal. The reference signal can provide a reference level indicative of an expected amplitude for the transmit signal. One or more embodiments provides for receiving a reference signal, the reference signal being digital; converting the reference signal from digital to analog; and generating the reference level responsive to the analog reference signal.

Furthermore, the procedure 701 can provide for determining 707 a difference between the amplitude of the transmit signal and the reference level, and generating a digital error signal which represents the error, that is the deviation of the amplitude from the reference level. Any of various well known techniques can be utilized to determine a difference between the amplitude and the reference level. The digital signal representing the error can indicate the direction and/or the magnitude of the error. For example, the error can be a positive or negative value to indicate whether the amplitude is too low or too high.

The procedure 701 also can include sampling 709 the digital error signal and determining an adjustment that is to be made to the power level. The digital error signal can be sampled as desired, for example, one every pre-determined increment of a clock signal. It can be determined whether any adjustment is desired, for example each time there is an error, or if the cumulative errors exceed a total amount, or if a certain number of errors occur within a particular time period, or if the average error exceeds a threshold based on the reference level, or the like. Accordingly, one or more embodiments can include periodically sampling the digital error signal, wherein the transmit power control can be altered responsive to the sampled digital error signal.

Based on the error indicated by the digital error signal, or on the cumulative error, average error, or the like, the adjustment to the gain provided to the transmit power control can be determined, which should zero out the error. Accordingly, one or more embodiments provide for determining the transmit power control. The adjustments can be pre-determined, for example by testing of a particular device in which the transmit power control and transmitter are provided, so that the adjustments to the gain are pre-determined and stored for later retrieval.

Also, the procedure 701 can provide for receiving 711 an adjustment signal and adjusting the amplifier gain for the transmit power control. The appropriate adjustment can be indicated in the adjustment signal. The adjustment signal can be provided to adjust the amplifier gain. Therefore, one or more embodiments provides that the adjusting includes receiving a digital indication of an adjustment, and adjusting a gain of an amplifier providing the transmit power control, responsive to the adjustment. Also, one or more embodiments can provide for converting the adjustment from digital to analog, wherein the gain is adjusted responsive to the analog adjustment.

Accordingly, one or more embodiments provides a method of adjusting a magnitude of a transmit signal. The method includes receiving a transmit signal; generating a digital error signal, responsive to the transmit signal, wherein the digital error signal represents a difference between an amplitude of the transmit signal and a reference level; providing a transmit power control, responsive to the digital error signal; and adjusting the transmit signal, responsive to the transmit power control.

It should be noted that the term communication unit may be used interchangeably herein with communication device, subscriber unit, wireless subscriber unit, wireless subscriber device or the like. Each of these terms denotes a device ordinarily associated with a user and typically a wireless mobile device that may be used with a public network, for example in accordance with a service agreement, ad hoc network, and/or within a private network such as an enterprise network. Examples of such units include personal digital assistants, personal assignment pads, and personal computers equipped for wireless operation, a cellular handset or device, or equivalents and evolutions thereof.

The communication systems and communication units of particular interest are those providing or facilitating transmission of voice communications or transmission of data, multimedia, or messaging over cellular wide area networks (WANs), such as conventional two way systems and devices, various cellular phone systems including analog and digital cellular, CDMA (code division multiple access) and variants thereof, GSM (Global System for Mobile Communications), GPRS (General Packet Radio System), 2.5 G and 3 G systems such as UMTS (Universal Mobile Telecommunication Service) systems, Internet Protocol (IP) Wireless Wide Area Networks like 802.16, 802.20 or Flarion, integrated digital enhanced networks and variants or evolutions thereof. Particularly of interest are communication systems, communication units, circuits, and methods configured for use in a wireless communication system.

Furthermore the wireless communication units or devices of interest may have short range wireless communications capability normally referred to as WLAN (wireless local area network) capabilities, such as IEEE 802.11, IEEE 802.15, Bluetooth, or Hiper-Lan and the like preferably using CDMA, frequency hopping, OFDM (orthogonal frequency division multiplexing) or TDMA (Time Division Multiple Access) access technologies and one or more of various networking protocols, such as TCP/IP (Transmission Control Protocol/Internet Protocol), UDP/UP (Universal Datagram Protocol/Universal Protocol), IPX/SPX (Inter-Packet Exchange/Sequential Packet Exchange), Net BIOS (Network Basic Input Output System) or other protocol structures. Alternatively the wireless communication units or devices of interest may be connected to a LAN using protocols such as TCP/IP, UDP/UP, IPX/SPX, or Net BIOS via a hardwired interface such as a cable and/or a connector. One or more embodiments can be used to control transmit power regardless of the application in which it is being used.

This disclosure is intended to explain how to fashion and use various embodiments in accordance with the invention rather than to limit the true, intended, and fair scope and spirit thereof. The invention is defined solely by the appended claims, as they may be amended during the pendency of this application for patent, and all equivalents thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A circuit for adjusting a magnitude of a transmit signal, comprising:
    a transmitter, providing a transmit signal;
    an amplifier, receiving the transmit signal and a power control adjustment signal, and responsive thereto, providing an amplified transmit signal;
    a detector, for detecting an amplitude of the amplified transmit signal;
    an error component for determining the difference between the amplitude and a reference level; and
    a digital signal generator, receiving the difference, and responsive thereto, generating a reference signal and the power control adjustment signal;
    wherein the reference level is responsive to the reference signal, and
    wherein the digital signal generator comprises
        an analog to digital circuit receiving the difference and generating a digital difference signal representative of the difference; and
        a processor configured to facilitate receiving the digital difference signal, processing the difference, and adjusting the reference signal and the power control signal responsive to the difference.

2. The circuit of claim 1, wherein the analog to digital circuit is an n-bit analog to digital circuit, where n is two or more.

3. The circuit of claim 1, wherein the difference is a signal provided by the error component, further comprising a multiplexer, multiplexing between a receive signal from a receiver corresponding to the transmitter, and the difference, to provide the difference and the receive signal to the digital signal generator.

4. The circuit of claim 3, wherein the multiplexer selects between the receive signal and the difference responsive to the digital signal generator.

5. The circuit of claim 1, further comprising
    a first digital to analog converter, for converting the reference signal from digital to analog;
    a second digital to analog converter, for converting the power control adjustment signal from digital to analog; and
    a radio frequency control block, receiving the reference signal and the power control adjustment signal, and translating the reference signal and the power control adjustment signal to values for the first digital to analog converter and the second digital to analog converter.

6. The circuit of claim 1, wherein there are a plurality of the reference levels including the reference level, the reference levels being pre-determined.

7. The circuit of claim 1, wherein the detector is configured to track out variations in at least one of a temperature, a process corner and a common-mode voltage.

8. A method for determining transmit power in a signal, comprising:
    detecting peaks in a transmit signal by using a detector;
    detecting an error from at least one error source affecting the transmit signal, relative to a reference level;
    detecting a deviation in the error from an error level; and
    correcting a transmitted output level for the error,
    wherein the at least one error source is a resistor, and
    wherein a DAC current is proportional to the tolerance of the resistor.

9. The method of claim 8, wherein the at least one error source is at least one of temperature variation and process corner variation.

10. The method of claim 8, wherein the at least one error source is common mode voltage, wherein the detecting farther comprises obtaining a difference between the actual peak voltage and the common mode voltage.

11. The method of claim 8, wherein the transmit signal is single ended.

12. The method of claim 8, wherein the transmit signal is differential.

13. A method of adjusting a magnitude of a transmit signal, comprising:
    receiving a transmit signal by using a receiving device;
    generating a digital error signal, responsive to the transmit signal, wherein the digital error signal represents a difference between an amplitude of the transmit signal and a reference level;
    periodically sampling the digital error signal once every predetermined increment of a clock signal;
    providing a transmit power control, responsive to a plurality of the sampled digital error signal signals; and
    adjusting the transmit signal, responsive to the transmit power control,
    wherein the transmit power control is provided based on whether an average error of the plurality of the sampled digital error signals exceeds a threshold error value.

14. The method of claim 13, farther comprising receiving a reference signal, the reference signal being digital, converting the reference signal from digital to analog, and generating the reference level responsive to the analog reference signal.

15. The method of claim 13, wherein the adjusting farther comprises receiving a digital indication of an adjustment, and adjusting a gain of an amplifier providing the transmit power control, responsive to the adjustment.

16. The method of claim 15, farther comprising converting the adjustment from digital to analog, wherein the gain is adjusted responsive to the analog adjustment.

17. The method of claim 13, further comprising determining the transmit power control.

* * * * *